US007178039B2

(12) United States Patent
Mueller

(10) Patent No.: US 7,178,039 B2
(45) Date of Patent: Feb. 13, 2007

(54) METHOD AND ARRANGEMENT FOR THE VERIFICATION OF NV FUSES AS WELL AS A CORRESPONDING COMPUTER PROGRAM PRODUCT AND A CORRESPONDING COMPUTER-READABLE STORAGE MEDIUM

(75) Inventor: Detlef Mueller, Barsbuettel (DE)

(73) Assignee: NXP B.V., Eindhoven (NL)

( * ) Notice: Subject to any disclaimer, the term of this patent is extended or adjusted under 35 U.S.C. 154(b) by 821 days.

(21) Appl. No.: 10/320,268

(22) Filed: Dec. 16, 2002

(65) Prior Publication Data

US 2003/0131210 A1    Jul. 10, 2003

(30) Foreign Application Priority Data

Dec. 19, 2001   (DE) ................. 101 62 306

(51) Int. Cl.
*G06F 12/14*    (2006.01)
(52) U.S. Cl. ....................... 713/193; 711/164
(58) Field of Classification Search ................ 713/193; 711/163, 164
See application file for complete search history.

(56) References Cited

U.S. PATENT DOCUMENTS 4,730,273 A * 3/1988 Sluss ........................... 365/96
4,935,645 A   6/1990 Lee ............................ 307/362
5,010,331 A   4/1991 Dias et al. ................... 340/825
5,345,413 A   9/1994 Fisher et al. .................. 365/96
5,469,557 A   11/1995 Salt et al. .................... 395/425
5,635,854 A * 6/1997 Shimanek et al. ............. 326/38
5,668,818 A * 9/1997 Bennett et al. .............. 714/726
6,373,771 B1 * 4/2002 Fifield et al. ............ 365/225.7
6,504,768 B1 * 1/2003 Roohparvar et al. ........ 365/200

FOREIGN PATENT DOCUMENTS

EP    0287338 A2    4/1988
WO    WO0019224     4/2000

* cited by examiner

*Primary Examiner*—Matthew Smithers
(74) *Attorney, Agent, or Firm*—Kevin H. Fortin

(57) ABSTRACT

The invention relates to a method and an arrangement for the verification of NV fuses as well as to a corresponding computer program product and to a corresponding computer-readable storage medium which can be used notably for the detection of attacks on the smart card security which modify EEPROM contents and hence also the contents of EEPROM fuses.

During the reset phase the fuses are read from the EEPROM. The fuse values successively read out are then automatically verified. One possible implementation is, for example, to load the fuse values read out into a signature register, followed by comparison with a reference value. Appropriate security measures can be activated should the automatic verification indicate an error, for example, due to unauthorized modification of a fuse or attack on the boot operation.

14 Claims, No Drawings

METHOD AND ARRANGEMENT FOR THE VERIFICATION OF NV FUSES AS WELL AS A CORRESPONDING COMPUTER PROGRAM PRODUCT AND A CORRESPONDING COMPUTER-READABLE STORAGE MEDIUM

The invention relates to a method and a device for the verification of NV fuses as well as to a corresponding computer program product and a corresponding computer-readable storage medium which can be used in particular for the detection of attacks on the smart card security which aim to modify EEPROM contents and hence also the contents of EEPROM fuses.

The evolution of microelectronics in the seventies has led to the manufacture of small computers having the format of a credit card without a user interface. Computers of this kind are referred to as smart cards. In such a smart card a data memory and an arithmetic and logic unit are integrated in a single chip which is no larger than a few square millimeters. Smart cards are used notably as telephone cards, GSM-SIM cards, in the field of banking field and in the field of health care. The smart card has thus become an omnipresent arithmetic means.

Nowadays smart cards are used mainly as a secure store for secret data and as a secure execution means for cryptographic algorithms. The assumption of a comparatively high degree of security of the data and algorithms on the card is based on the hardware construction of the card and the interfaces to the environment. To the environment the card represents a "black box" whose functionality can be accessed only via a well-defined hardware and software interface and which is capable of imposing specific security policies. On the one hand, the access to data can be made subject to given conditions. Critical data such as, for example, the secret keys of a Public Key method, can even be completely excluded from access from the outside. On the other hand, a smart card is capable of carrying out algorithms without it being possible to observe the execution of the individual operations from the outside. The algorithms themselves can be protected against modification and reading out on the card.

In an object-oriented sense the smart card can be considered as an abstract encapsulated type which includes a well-defined interface, exhibits a specific behavior and is capable itself of ensuring that given integrity conditions in relation to its state are satisfied.

In principle there are two different types of smart cards. Memory cards comprise merely a serial interface, an addressing and security logic circuit and ROM and EEPROM memories. These cards have a limited functionality only and serve a specific purpose. Therefore, their manufacture is very inexpensive. Smart cards manufactured as microprocessor cards in principle constitute a complete universal computer.

The following phases can be distinguished in the process of manufacture and delivery of chip cards:
  manufacturing the semiconductor;
  encapsulating the semiconductor;
  printing the card;
  personalizing the card; and
  issuing the card.

Generally speaking, each phase is carried out by a company that is specialized in the relevant field. For the manufacture of the semiconductors a high degree of security has to be ensured within the relevant company, that is, notably for cards provided with a wired security logic circuit. In order to enable the manufacturer to perform a correct final test, the complete memory must be freely accessible. The chip is secured by a transport code only after completion of the final test. After that the card memory can be accessed only by authorized agencies that know the transport code. Theft of semiconductors fresh from the factory, therefore, will remain without consequences. Authorized agencies may be personalizers or issuers of cards. The encapsulation and printing do not require further security functions. The companies concerned need not know the transport code.

Generally speaking, the transfer of the person-specific data to the card is not carried out by the manufacturer of the card but by the agency issuing the card (for example, a bank, a telephone company, a health insurance company etc.). This procedure is referred to as personalization. In order to carry out this procedure it is necessary to know the transport code.

The actual issuing of the card, that is, the transport from the agency issuing the card to the cardholder, poses a further security problem. Strictly speaking, the only secure way is to hand over the card to the card holder in person who signs for receipt after having shown proof of identity. Distribution by mail is often more economical, but also rather insecure. A problem is also posed by the transfer of the PIN to the card holder; the same care must be then taken as for the issuing of the card itself.

Because of the crucial, security-relevant contents of the memories accommodated on smart card controllers, it does not suffice to take only the aforementioned security measures; additional protection must be provided against any attacks by hackers which may be aimed at all phases of the service life of a smart card, that is, the manufacture, the transport and the use of the card as well as manipulation of cards which have become useless.

In order to ensure an as high as possible security of the smart card controllers, EEPROM fuses are used so as to adjust various states (for example, test/user mode, configurations, trimming parameters for analog circuit components etc.). Such fuses are characterized inter alia in that they are programmable and hence do not have a physical state, which is secured in all circumstances. Generally speaking, attacks could be made on the smart card security so as to modify the EEPROM contents and hence also the contents of EEPROM fuses.

Automatic but non-verified reading out of EEPROM fuses by means of a boot sequence during the reset phase is already being carried out. Manipulations of the fuse values, carried out either by manipulation of the contents of the fuse cells or manipulations during reading out, are not recognized and can offer an attacker unauthorized access, for example, to a smart card.

U.S. Pat. No. 5,469,557 describes a microcontroller device, which includes a CPU, program memories for storing instructions to be executed by the CPU, and data memories. The contents of each memory are protected by an EEPROM fuse and are automatically erased should the code of the EEPROM fuse be modified.

The document WO 00/19224 describes a circuit configuration having a scan path that can be deactivated. The circuit configuration disclosed therein includes a number of function blocks (FB1 . . . FBN), each function block being connected to at least one of the other function blocks and at least a portion of these connections being provided in the form of a respective interlocking element (SFF1 . . . SFFm) which can be switched over from the normal mode to a test mode by means of an activation line (scan enable) and which includes an additional data input and data output. Said additional data inputs and data outputs are interconnected by data line sections (DL1 ... DL1) in such a way that the interlocking elements (SFF1 ... SFFm) form a shift register which in turn forms a scan path. At least one electrically programmable security element (SE) is arranged along the activation line (scan enable) and/or the data line sections (DL1 ... DLL), which security element (SE) either interrupts the line concerned or connects it to a defined potential.

The above known methods do not recognize attacks on the smart card security which modify the EEPROM contents and hence also the contents of EEPROM fuses so that, for example, already manipulated EEPROM fuses are read out upon reset.

Therefore, it is an object of the invention to provide a method, an arrangement as well as a corresponding computer program product and a corresponding computer-readable storage medium of the kind set forth which eliminate the drawbacks of the customary security measures and notably enable the recognition of unauthorized manipulations of fuse contents/values.

In accordance with the invention this object is achieved as disclosed in the characterizing part of the claims 1, 13, 15 and 16 in conjunction with the features disclosed in the introductory part. Effective embodiments of the invention are disclosed in the dependent claims.

A special advantage of the method of verifying NV fuses consists in that automatic verification of the NV fuse value (values) takes place while one or more NV fuse values are read out from fuse cells of a non-volatile memory.

An arrangement for the automatic verification of NV fuses is advantageously conceived so that it includes a processor which is arranged in such a manner that automatic verification of NV fuses can be carried out in that verification of the NV fuse value (values) takes place while one or more NV fuse values are read out from fuse cells.

A computer program product for the automatic verification of NV fuses includes a computer-readable storage medium on which a program is stored which enables a computer or smart card controller, after having been loaded into the memory of the computer or the smart card controller, to carry out an automatic verification of NV fuses in that the NV fuse value (values) is (are) verified while one or more NV fuse values are read out from fuse cells.

In order to carry out automatic verification of NV fuses, use is preferably made of a computer-readable storage medium on which a program is stored which enables a computer or smart card controller, after having been loaded into the memory of the computer or the smart card controller, to carry out the automatic verification of NV fuses in that the NV fuse value (values) is (are) verified while one or more NV fuse values are read out from fuse cells.

A further advantage of the method in accordance with the invention resides in the fact that the NV fuse value (values) is (are) stored in the EEPROM of a microcontroller, notably of a smart card controller. In a preferred version of the method in accordance with the invention the reading out is performed by means of a boot sequence during the reset phase.

It has been found that the verification of the NV fuse value (values) is advantageously performed by loading the NV fuse value (values) read out into an accumulation unit and by subsequently carrying out a comparison with a reference value. Moreover, in a preferred version of the method in accordance with the invention it is arranged that the verification of the NV fuse value (values) takes into account equalization values and/or configurations.

For the automatic verification of NV fuses it may be advantageous to utilize an accumulation unit in the form of a signature register. In a further preferred version of the method in accordance with the invention it is arranged that the reference value is also an NV fuse value.

A further advantage of the method in accordance with the invention resides in the fact that security measures are initiated in the case of an error message during the verification of the NV fuse value (values). It has been found that the security measures advantageously consist of:
a reset and/or
the erasure of the entire EEPROM, or
the inhibiting of selected functions.

Moreover, it is an advantage of the method in accordance with the invention that if necessary, notably in the test mode, the verification of the NV fuse value (values) is deactivated. A further advantageous version of the method in accordance with the invention consists in that a hardware trapdoor is used to deactivate the verification of the NV fuse value (values). An advantage of the method in accordance with the invention also resides in the fact that a password is used to protect the microcontroller in the case of deactivated verification of the NV fuse value (values).

A preferred embodiment of the arrangement in accordance with the invention consists in that the processor forms part of a smart card controller and that the arrangement is a smart card.

A major advantage of the invention consists in that above all it enables the recognition of attacks on the smart card security which are capable of modifying the EEPROM contents and hence also the contents of EEPROM fuses, and that it offers the possibility of appropriately reacting to such attacks, for example, by blocking the card or by taking other steps inhibiting the execution of user applications by means of manipulated fuse values.

An embodiment of the invention will be described in detail hereinafter by way of a non-limitative example.

When the invention is carried out, the fuses are successively read out from the EEPROM by means of a boot sequence during the reset phase. The essential point is that the fuse values successively read out are automatically verified. One feasible implementation is, for example, to load the fuse values read out into an accumulation unit (for example, a signature register), followed by comparison with a reference value. The reference value itself may also be, for example, an EEPROM fuse value in order to enable, if necessary, equalization values or configurations to be included in the verification of the fuses. Should the automatic verification indicate an error, for example, due to unauthorized modification of fuses or an attack on the boot operation, appropriate security measures can be initiated; such measures may consist of, for example, a reset or also of an erasure of the entire EPROM or the inhibiting of given functions.

Because the contents of an EEPROM are undefined after the production of the silicon, the automatic fuse verification must be deactivated by means of a hardware trapdoor, which also serves to enter the test mode. Execution of the user application by means of manipulated fuses is thus precluded, while the test mode is protected against unauthorized use by additional security measures such as, for example, the use of a password.

The invention is not limited to the embodiments described herein. To the contrary, further embodiments can be realized by combination and modification of the described means and features without departing from the scope of the invention.

The invention claimed is:

1. A method for the verification of NV fuses, the method comprising:

automatically verifying that at least one NV fuse value has not been changed while the at least one NV fuse value is read out from a fuse cell of a non-volatile memory;

loading the at least one NV fuse value read out from the fuse cell into an accumulation unit;

comparing the at least one NV fuse value with a reference value; and initiating security measures in the case of an error message during the verification of the at least one NV fuse value.

2. A method as claimed in claim 1, wherein the at least one NV fuse value is stored in the EEPROM of a microcontroller.

3. A method as claimed in claim 1, wherein reading out is performed by means of a boot sequence during a reset phase.

4. A method as claimed in claim 1, wherein the at least one NV fuse value is verified using at least one of equalization values and configurations.

5. A method as claimed in claim 1, wherein the accumulation unit is a signature register.

6. A method as claimed in claim 1, wherein the reference value is also a NV fuse value.

7. A method as claimed in claim 1, wherein the security measures include at least one of:

a reset;

the erasure of the entire EEPROM, and the inhibiting of selected functions.

8. A method as claimed in claim 1, further including using a test mode to disable the verification of the at least one NV fuse value.

9. A method as claimed in claim 8, wherein a hardware trapdoor is used to disable the verification of the at least one NV fuse value.

10. A method as claimed in claim 2, wherein a password is used to protect the microcontroller when verification of the at least one NV fuse value is disabled.

11. An arrangement comprising:

a processor which is arranged in such a manner that automatic verification of NV fuses can be carried out by verifying that at least one NV fuse value has not been changed while at least one NV fuse value is read out from a fuse cell;

an accumulation unit comparing the at least one NV fuse value with a reference value read out from the fuse cell; and said processor initiating security measures in the case of an error message during the verification of the at least one NV fuse value.

12. An arrangement as claimed in claim 11, wherein the processor forms part of a smart card controller and that the arrangement is a smart card.

13. A computer program product comprising a computer-readable storage medium on which a program is stored which enables a computer or smart card controller, after having been loaded into the memory of the computer or the smart card controller, to carry out an automatic verification of NV fuses by loading the at least one NV fuse value read out from the fuse cell into an accumulation unit; comparing the at least one NV fuse value with a reference value; and initiating security measures in the case of an error message during the verification of the at least one NV fuse value.

14. The method of claim 2, wherein the microcontroller is a smart card controller.

* * * * *